United States Patent
Chen

(10) Patent No.: US 6,841,475 B1
(45) Date of Patent: Jan. 11, 2005

(54) METHOD FOR FABRICATING THIN FILM TRANSISTORS

(75) Inventor: KunHong Chen, Danshuei (TW)

(73) Assignee: AU Optronics Corporation, Hsin-Chu (JP)

( * ) Notice: Subject to any disclaimer, the term of this patent is extended or adjusted under 35 U.S.C. 154(b) by 0 days.

(21) Appl. No.: 10/718,890

(22) Filed: Nov. 21, 2003

(51) Int. Cl.⁷ .............................................. H01L 21/44
(52) U.S. Cl. ..................... 438/671; 438/735; 438/157
(58) Field of Search ......................... 438/717, 734–737, 438/942–952, 157, 283, 669–671

(56) References Cited

U.S. PATENT DOCUMENTS 6,479,398 B1 * 11/2002 Chen et al. ................. 438/734
2004/0089900 A1 * 5/2004 Ishikawa et al. ............ 257/347
2004/0110327 A1 * 6/2004 Ishikawa .................... 438/151

* cited by examiner

Primary Examiner—Matthew Smith
Assistant Examiner—Calvin Lee
(74) Attorney, Agent, or Firm—Duane Morris LLP

(57) ABSTRACT

A method is disclosed for forming a thin film transistor. A photoresist layer is formed on top of the preliminary substrate. A portion of the photoresist layer is selectively removed in a single exposure process to form a photoresist pattern having a two-portion structure with a first portion having a first width and a second portion underneath the first portion with a second width. Such a photoresist pattern helps to reduce the number of mask processes used for forming the thin film transistor.

20 Claims, 5 Drawing Sheets

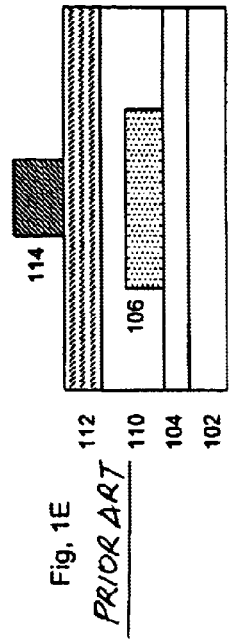
Fig. 1A PRIOR ART
Fig. 1B PRIOR ART
Fig. 1C PRIOR ART
Fig. 1D PRIOR ART
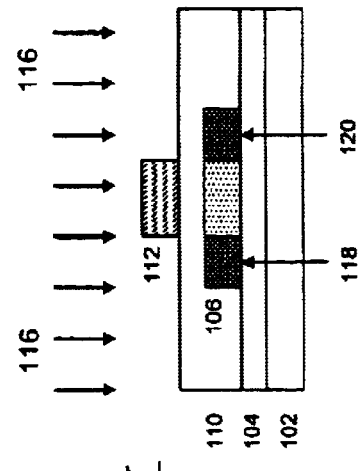
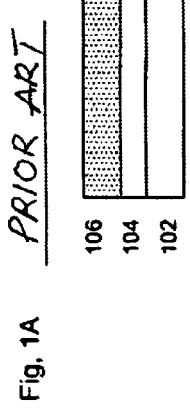
Fig. 1E PRIOR ART
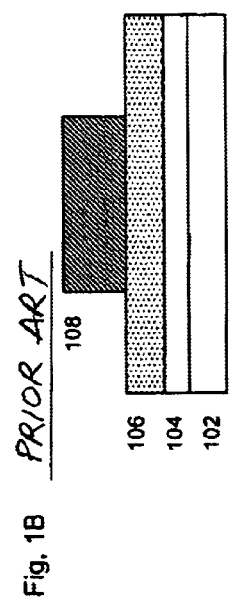
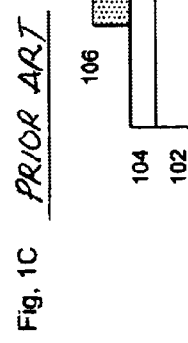
Fig. 1F PRIOR ART
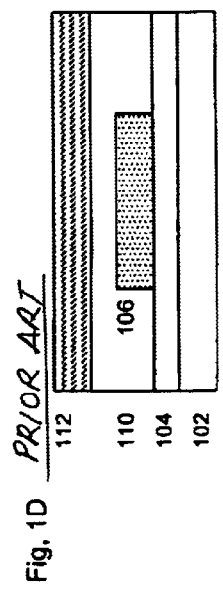

METHOD FOR FABRICATING THIN FILM TRANSISTORS

BACKGROUND

The present disclosure relates generally to semiconductor device manufacturing, and more particularly to the fabrication methods of thin film transistors used in electro-optical display devices, sensors, and the like.

The manufacture of semiconductor integrated circuits (ICs) and devices require the use of many photolithography process steps to define and create specific circuit components and circuit layouts onto an underlying substrate. Conventional photolithography systems project specific circuit and/or component images, defined by a mask pattern reticle, onto a flat substrate coated with a light sensitive film (photoresist) coating. After image exposure, the film is then developed leaving the printed image of the circuit and/or component on the substrate. The imaged substrate is subsequently processed with techniques such as etching and doping to alter the substrate with the transferred pattern. Photolithography processes are used multiple times during the fabrication of thin film transistors (TFTs) that are used in electro-optical display devices and sensors.

Each photolithography process sequence represents invested fabrication costs to the final cost of the completed device. Such fabrication costs include all costs related to materials, labor, facilities, production yield losses and the time spent in the production state. Any process flow simplification that provides a reduction in any of the above mentioned cost areas will provide a net improvement to the final cost of fabricating the device. It is highly desirable to create and implement new process flows that feature process simplifications to lower fabrication costs. The reduction of photolithography process sequences represents a form of process simplification. Such process simplification will provide significant cost improvement for a given production facility to maintain highly competitive cost and output advantages over other manufacturers of similar product devices.

Referring now to FIGS. 1A through 1J, there are cross-sectional views of the production process sequences of a conventional p-channel thin film transistor (P-TFT) utilizing six photolithography masks. FIG. 1A shows a flat glass substrate 102 initially processed to obtain two additional films stacked upon the substrate surface. A buffer layer 104, usually comprised of an insulating material such as silicon oxide, is either deposited using chemical vapor deposition, or thermally grown in a gaseous environment. A poly-silicon layer 106 is then deposited upon the glass-buffer layer stack. The poly-silicon layer 106 is usually deposited using chemical vapor deposition and may be lightly doped during the deposition process with either n-type or p-type dopants. The optional doping of the poly-silicon layer 106 allows for the adjustment of the TFTs' voltage threshold characteristics along the transistor electrical gate channel that is defined during subsequent steps. It is noted that some conventional flows may use amorphous silicon as the material layer instead of the poly-crystalline silicon layer 106 used in this description.

The first photolithographic mask pattern 108 is placed on top of the poly-silicon 106, buffer 104; glass substrate 102 stack as shown in FIG. 1B. The mask pattern 108 is used to pattern the poly-silicon regions 106 where transistors will be located on the buffer layer 104 and substrate 102. The poly-silicon regions 106 under the mask pattern 108 are blocked from the poly-silicon etching process, thus forming segregated poly-silicon areas 106 as shown in FIG. 1C, that will subsequently become the base for an individual TFT device or simply TFT. A dielectric layer 110 such as silicon oxide is then either thermally grown in a gaseous environment or deposited by chemical vapor deposition on top of the exposed poly-silicon 106 and buffer 104 areas, as shown in FIG. 1D. This dielectric layer 110 is also known as the gate oxide layer, later serving as the gate dielectric of the TFT. FIG. 1D also shows the next layer, the gate metal layer 112, deposited on top of the gate oxide layer 110. The gate metal layer 112 is usually deposited upon the gate oxide 110 surface by ion sputtering of a metal source or by a chemical electrolysis process.

FIG. 1E shows the second photolithography mask pattern 114 situated on top of the gate metal layer 112. This mask pattern 114 allows for the etching-off of selected gate metal areas to create the TFT gate electrodes, as well as gate metal lines horizontal to the substrate 102 plane to connect selected multiple TFT gates forming specific circuit paths. The gate metal etch is usually performed using wet chemistries and may be supplemented with a dry chemical plasma etch.

FIG. 1F illustrates the view of the gate electrode 112 after the etching of the gate metal layer and after the removal of the mask pattern 114. After the removal of the mask pattern 114, the poly-silicon regions 118 and 120 adjacent to but not directly under the gate electrode 112 are doped with a p-type dopant. This doping process, usually accomplished by ion implantation 116 of p-type dopants such as boron or boron-difluoride, creates the TFTs' P+ source 118 and drain 120 regions within the poly-silicon area 106. It is noted that the poly-silicon region 106 located directly under the gate region, not doped by the doping process becomes the TFTs' electrical gate channel. The active TFT components, source 118, drain 120, gate 112 and transistor channel regions are now complete. It is also noted that the ion implantation process 116 is calibrated such that dopant placement is primarily located within the poly-silicon regions 118 and 120 and the gate metal 112 blocks the doping of the transistor gate channel. For the fabrication of n-channel TFT structures, the source/drain ion implantation 116 will utilize n-type dopants such as phosphorus to create N+ source and drain regions. A thermal anneal process (not shown in the attached figures) is usually performed after the source, drain doping process to repair any physical damage to the doped layers, as well as to activate and distribute the added dopants.

FIG. 1G illustrates the cross-sectional view of the TFT device after processing through the third mask. The figure shows an interlevel dielectric (ILD) layer 122 that has been deposited on top of the gate metal 112. The ILD layer 122 has been patterned and etched to create selected areas of vertical openings 124 from the top surface of the ILD layer 122 down to expose the TFT source 118 and drain 120 regions. The ILD layer 122 is usually created by a chemical deposition process and etched using a wet chemical and/or dry chemical plasma process. The vertical openings 124 are then lined and filled with conductive metal(s), usually by ion sputtering, to provide a vertical interconnection path from the top of the ILD layer 122 to the TFTs' source 118 and drain 120 regions.

After the creation of the filled vertical interconnections, a new blanket metal layer 126 is then deposited upon the ILD layer 122. This metal layer 126 is usually created by ion sputtering of a metal source or by a chemical electrolysis process. The fourth mask (not shown) is then placed on top of the metal layer 126, used to define and create the horizontal metal lines connecting selected source 118 and drain 120 regions of selected TFTs to form a desired circuit. FIG. 1H shows the cross-sectional view of the TFT device after the fourth mask pattern has been applied and the metal pattern etched. The new metal lines 126 on top of the ILD layer 122 are shown connected to the TFT source 118 and drain 120 regions through the previously created and filled vertical interconnects 124. After the formation of the metal lines 126, a passivation dielectric layer 128 is then deposited on top of the TFT device.

FIG. 1I shows the cross-sectional view of the TFT device after using the fifth mask. The fifth mask pattern has been placed on top of the passivation layer 128 and used to selectively etch off certain regions of the layer to expose a vertical interconnect path opening 130 to the last-placed metal lines 126. The etched openings 130 are vertical interconnection paths to connect the last-placed (source and drain) metal lines 126 to the next metal lines that will be created on the top surface of the passivation layer 128. The passivation dielectric layer 128 is usually created by a chemical deposition process and etched using a wet chemical and/or dry chemical plasma process. The vertical openings 130 are lined and filled with conductive metal(s), usually by ion sputtering.

After the vertical interconnection openings 130 are lined and filled with conductive metal(s), a final routing metal layer 132 is deposited upon the surface of the passivation layer 128. This final metal layer 132, usually comprised of indium tin oxide (ITO), is then patterned using the sixth and final mask pattern to create the circuit paths for final routing of the TFTs' source 118 and drain 120 regions. FIG. 1J illustrates this showing the filled vertical interconnection openings 130 and the etched ITO metal lines 132. After the completion of this sixth mask processing, the basic TFT device is completed.

It is again noted any process flow simplification that provides a reduction in any of the above mentioned process operations will provide a net improvement to the final cost of fabricating the device.

What is desirable is an improved process flows that feature process simplifications to lower fabrication costs while maintaining the required physical and electrical performance characteristics of the semiconductor device and components.

SUMMARY

A method is disclosed for forming a thin film transistor from a preliminary substrate having at least a silicon layer, a first dielectric layer, and a gate metal layer stacking up sequentially. A photoresist layer is formed on top of the preliminary substrate. A portion of the photoresist layer is selectively removed in a single exposure process to form a first photoresist pattern having a two-portion structure with a first portion having a first width and a second portion underneath the first portion with a second width. The gate metal layer, the first dielectric layer, and the silicon layer are reduced to have the same width as the second width. The first photoresist pattern is then reduced to form a second photoresist pattern having the first width. The gate metal layer is then made to have the same width as the first width using the second photoresist pattern. The silicon layer is doped with a predetermined impurity for forming a source region and a drain region of a predetermined type in areas not directly underneath the reduced gate metal layer.

Utilizing the single, two-portion photoresist structure leads to significant cost savings comparing to the conventional TFT process flow requiring two separate mask pattern levels to accomplish the same goal.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 1A to 1J illustrate cross-sectional views of a conventional p-channel thin film transistor (P-TFT) going through a conventional production process utilizing six photolithography masks.

DESCRIPTION

The present disclosure describes a methodology for the effective fabrication of thin film transistors (TFTs) using five photolithography masks as opposed to six masks as used in conventional production flows. The electrically active transistor areas of the final completed TFT devices fabricated in accordance with the present disclosure feature regions and components that are of identical composition and dimensions as those fabricated by the conventional simplifying mask productive flow. For simplifying the illustration, a production process for making a p-channel thin film transistor is used, but it is understood that the process is applicable to n-channel devices as well with appropriate and obvious modifications such as using different doping materials.

Figure 1G:
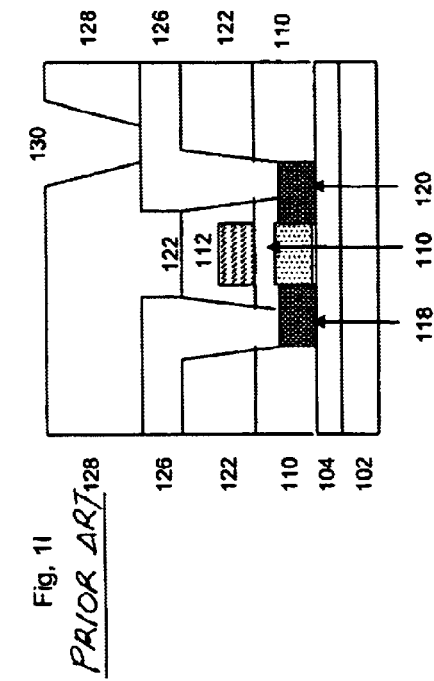
Figure 1H:
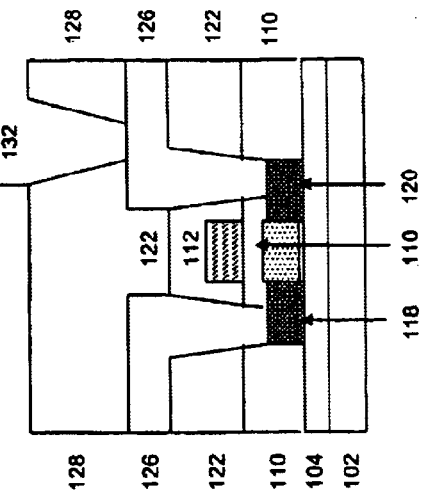
Figure 1I:
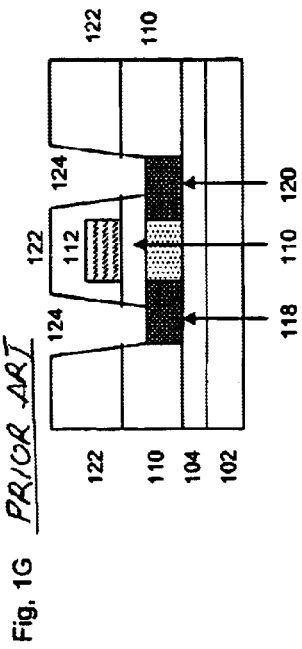
Figure 1J:
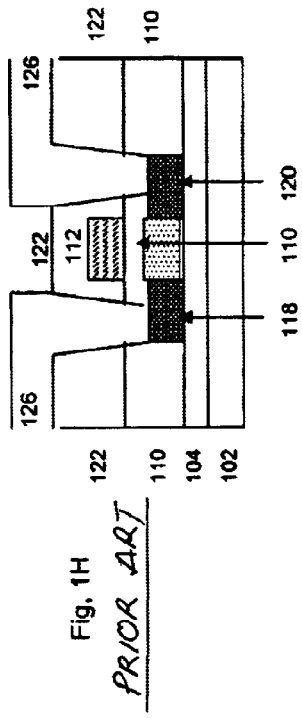
Figure 2E:
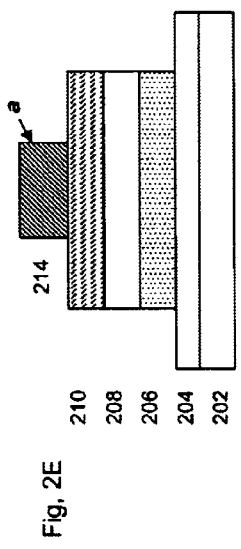
FIGS. 2A to 2K illustrate cross-sectional views of a thin film transistor going through a fabrication process utilizing five photolithography masks according to one example of the present disclosure.
Figure 2F:
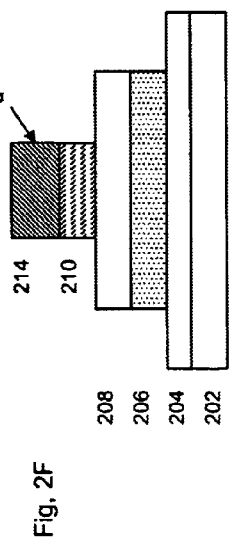
Figure 2G:
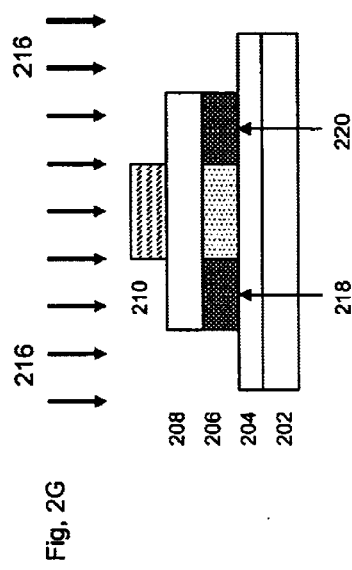
Figure 2A:
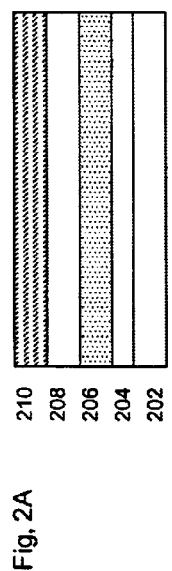
Figure 2B:
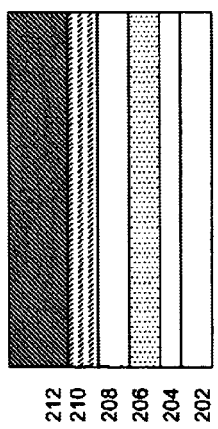

FIGS. 2A through 2K are cross-sectional views of a p-channel thin film transistor (P-TFT) in production process sequences utilizing five photolithography masks in accordance with one example of the present disclosure. FIG. 2A shows a flat glass substrate 202 initially processed to obtain four additional films stacked upon the substrate surface. First, a buffer layer 204, usually comprised of an insulating material such as silicon oxide, is either deposited using chemical vapor deposition, or thermally grown in a gaseous environment. A poly-silicon (or amorphous silicon) layer 206 is then deposited upon the glass-buffer layer stack. The poly-silicon layer 206 is usually deposited using chemical vapor deposition and may be lightly doped during the deposition process with either n-type or p-type dopants. A dielectric layer 208 such as silicon oxide is then either thermally grown in a gaseous environment or deposited by chemical vapor deposition on top of the poly-silicon 206 and buffer 204 layers. This dielectric layer 208 is also known as the gate oxide layer, later serving as the gate dielectric of the TFT device. The next layer, the gate metal layer 210, is deposited on top of the gate oxide layer 208. The gate metal layer 210 is usually deposited upon the gate oxide layer 208 by ion sputtering of a metal source or by a chemical electrolysis process. FIG. 2B illustrates that a first photoresist layer 212 has been coated on the gate metal layer 210 in the manufacturing process.

Figure 2C:
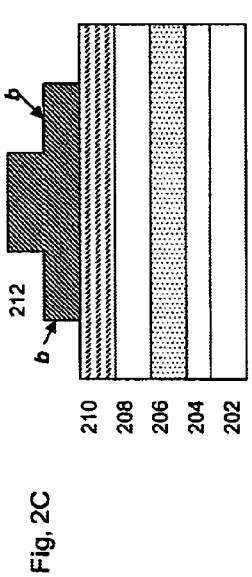

As shown in FIG. 2C, the first photoresist layer is selectively removed to leave a first photoresist pattern 212 on top of the gate metal layer 210 after a first photolithographic mask is used. The mask used may be of a half-tone mask type having at least two regions on the mask that pass the light at different rates. Because of the light dosage difference, different portions of the photoresist layer are activated to different degrees so that a distinct two-portion structure 212 is formed for each transistor. The two-portion photoresist structure 212 as shown in FIG. 2C features a first portion a having a predetermined geometry (e.g., height and width). The second portion b of the photoresist structure underneath a features a different geometry (e.g., width and height) surrounds the first portion a to create a two-portion single photoresist structure. It is understood that although a and b are referred to as two portions, it is really one photoresist pattern with exactly the same material. The two-portion structure may also be referred to as a step structure as well as one "steps up" from the other. The half-tone masks used can have different designs. It is further understood that for the following illustration, the widths of the first and second portions of the first photoresist pattern are shown as a point of reference to describe the changes of the layered material for making the TFT, but it is understood that the entire geometry of these layered materials change accordingly. Further, in one example, the half-tone mask has their center region made of a different material than its surrounding region to provide the capabilities for obtaining varied light shielding, thereby imposing varied light exposure dosage in a single exposure process upon the photoresist film. In another example, the two regions of the half-tone masks are made from the same material, but the center region may have a predetermined pattern for blocking or hindering the light from passing through at the same rate as the surrounding region.

Figure 2D:
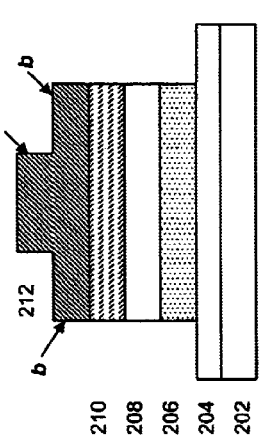

After placement of the first photoresist pattern 212 upon the layered substrate stack 202–210, the non-patterned, exposed areas of the stack as defined by the area covered by both portions a and b of the two-portion photoresist structure, is then subjected to etch processes to remove the top three layers: the gate metal 210, gate oxide 208 and poly-silicon 206 layers. FIG. 2D illustrates the view of the device after the etch processes. Typical etch processes used for this stack etch may include wet and dry plasma etch methods.

The two-portion photoresist pattern is then selectively reduced to form a second photoresist pattern 214 such that the two-portion structure becomes a single portion structure with the same width as the original first portion a. This can be done by a dry etch process or an auto plasma process. The second photoresist structure 214 has the same photoresist area as that of the first portion a of the original two-portion structure 212. FIG. 2E shows the view of the TFT device with the reduced photoresist pattern 214 located on top of the etched stack layer 206–210. The device with the reduced photoresist pattern 214 is then subjected to another etch process for etching only the exposed gate metal layer 210. This etch may be accomplished by using wet chemistry and may be supplemented with a dry chemical plasma etch. The resulting TFT device is shown in FIG. 2F. The use of the first mask is now complete and the photoresist 214 is now removed.

At the completion of this process step, two key transistor definition steps are accomplished. The use of the first photoresist pattern 212 to etch the gate metal 210, gate oxide 208 and the poly-silicon 206 layers segregates the poly-silicon 206 layer into individual regions for the locations of individual TFTs. The use of the second photoresist pattern 214 to etch the gate metal layer 210 creates the gate electrodes of each TFT. It is noted that by utilizing the single, two-portion photoresist structure 212 significant cost savings can be realized by the provided process simplification comparing to the conventional TFT process flow requiring two separate mask pattern levels to accomplish the two transistor definition steps.

FIG. 2G illustrates the cross-sectional view of the gate electrode 210 after the removal of the photoresist pattern 214. After removal of the photoresist pattern 214, the poly-silicon regions 218 and 220 adjacent to, but not directly under the gate electrode 210, are doped with a p-type dopant. This doping process, usually accomplished by ion implantation 216 of p-type dopants such as boron or boron-difluoride, creates the TFTs' P+ source 218 and drains 220 regions within the poly-silicon 206 area. It is noted the poly-silicon region 206 located directly under the gate region, not doped by the doping process becomes the TFTs' electrical gate channel. The active T° F. components, source 218, drain 220, gate 210 and transistor channel regions are now completed. It is also noted that the ion implantation process 216 is calibrated such that dopant placement is primarily located within the poly-silicon regions 218 and 220 and that the gate metal 210 blocks the doping of the transistor gate channel. For the fabrication of n-channel TFT structures, the source/drain ion implantation 216 will utilize n-type dopants such as phosphorus to create N+ source and drain regions. A thermal anneal process (not shown in the attached figures) is usually performed after the source, drain doping process to repair any physical damage to the doped layers, as well as to activate and distribute the added dopants.

Figure 2H:
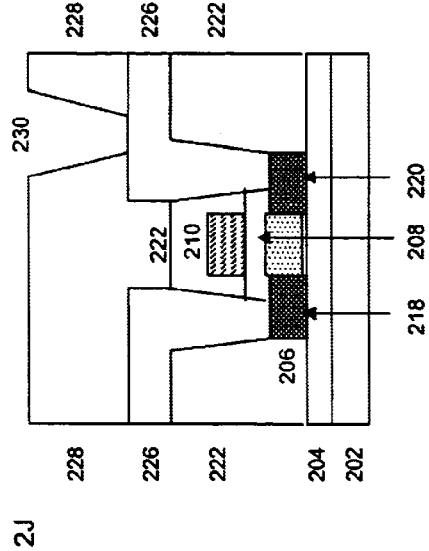

FIG. 2H illustrates the cross-sectional view of the TFT device after processing through a second mask pattern. FIG. 2H shows an interlevel dielectric (ILD) layer 222 deposited on top of the gate metal 210 and the gate oxide layer 208 after the creation of the doped TFT source 218 and drain 220 regions. The ILD layer 222 has been patterned and etched to create selected areas of vertical openings 224 from the top surface of the ILD layer 222 to expose the TFT source 218 and drain 220 regions. The ILD layer 222 is usually created by a chemical deposition process and etched using a wet chemical and/or dry chemical plasma process.

The vertical openings 224 are then lined and filled with conductive metal(s), usually by ion sputtering, to provide a vertical interconnection path from the top of the ILD layer 222, to the TFTs' source 218 and drain 220 regions. After the creation of the filled vertical interconnections, a new blanket metal layer 226 is then deposited upon the ILD layer 222. This metal layer 226 is usually created by ion sputtering of a metal source or by a chemical electrolysis process.

Another mask or the third mask in the process is then used to define and create the horizontal metal lines for forming desired circuits. FIG. 2I shows the view of the TFT device after the third mask has been applied and the metal pattern etched. The new metal lines 226 on top of the ILD layer 222 are shown connected to the TFT source 218 and drain 220 regions through the previously created and filled vertical interconnects 224. After formation of the metal lines 226, a passivation dielectric layer 228 is then deposited on top of the TFT device.

Figure 2J:
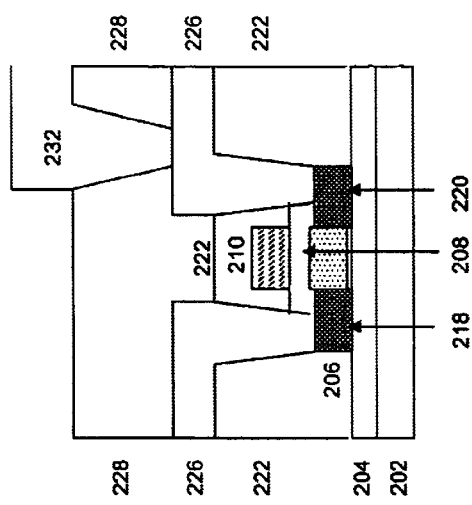
Figure 2I:
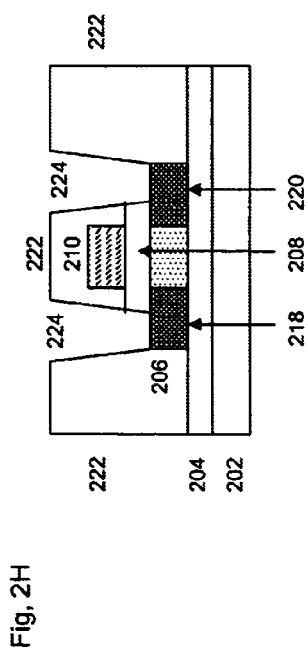

FIG. 2J shows the view of the TFT device after applying another mask or the fourth mask in the process. The fourth mask has been placed on top of the passivation layer 228 and used to selectively etch off certain regions of the layer to expose a vertical interconnection opening 230 to the last-placed metal lines 226. The etched openings 230 are vertical interconnection paths to connect the last-placed (source and drain) metal lines 226 to the next metal lines that will be created on the top surface of the passivation layer 228. The passivation dielectric layer 228 is usually created by a chemical deposition process and etched using a wet chemical and/or dry chemical plasma process. The vertical openings 230 are lined and filled with conductive metal(s), usually by ion sputtering.

Figure 2K:
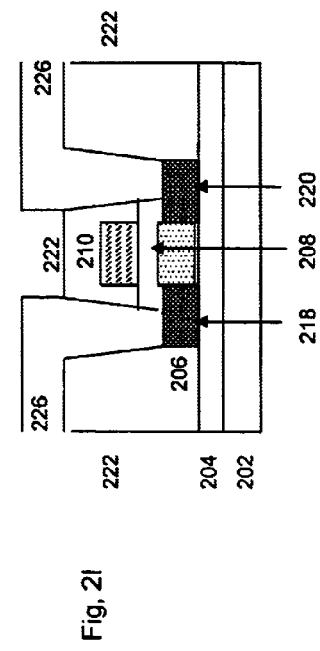

After the vertical interconnection openings 230 are lined and filled with conductive metal(s), the final metal layer 232 is deposited upon the surface of the passivation layer 228. This final metal layer 232, usually comprised of indium tin oxide (ITO), is then patterned using the fifth and final mask to create the circuit paths for final routing of the TFTs' source 218 and drain 220 regions. FIG. 2K illustrates this showing the etched ITO metal lines 232. At this point, the basic TFT device is completed by using only five masks in the manufacturing process.

Figure 3:
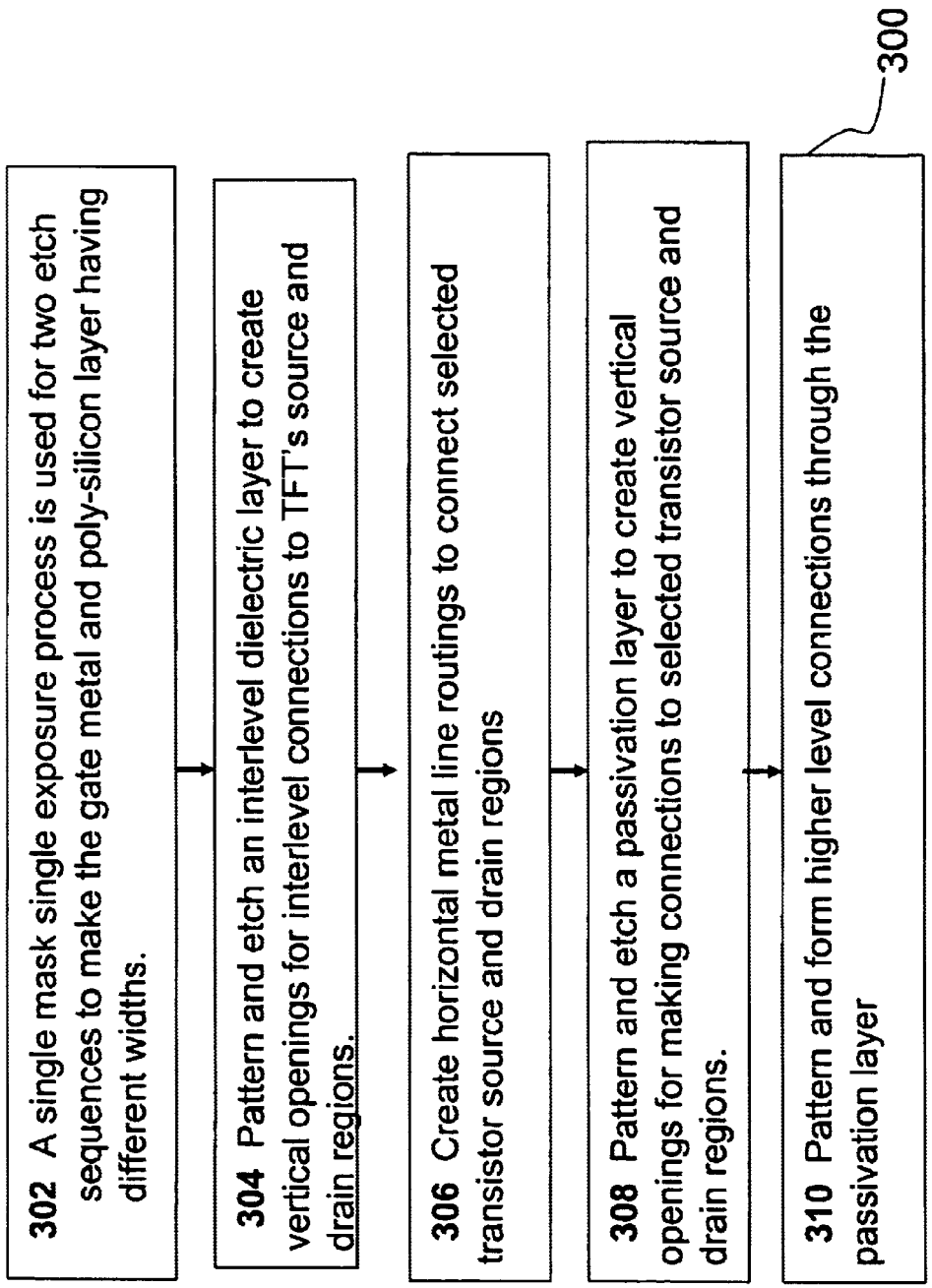
FIG. 3 is a flow diagram summarizing the production process illustrated in FIGS. 2A to 2K.

FIG. 3 is a flow diagram 300 summarizing the purpose and sequence of each photolithography mask process for the above detailed thin film transistor (TFT) fabricated in accordance with the present disclosure. In step 302, the first mask is used to allow for multiple etch processes to be performed using a single photoresist pattern. The process patterns and etches the poly-silicon layer and the gate metal layer to create the individual locations for each TFT using a two-portion structure of a photoresist pattern in a single exposure process. The use of only one mask to formulate the gate metal layer and the poly-silicon layer with different widths reduces manufacturing cost for making such a TFT device. In step 304, the process patterns and etches a dielectric layer to create vertical openings for interlevel connections between the TFTs' source and drain regions and the next metal layer. Metal connections are then made to the source and drain regions and an overlaying metal layer is placed on top. In step 306, the process patterns the overlaying metal layer to create specific circuit routes with connections to the TFT's source and drain regions. In step 308, the process patterns and etches a passivation layer over the devices to create vertical interconnect openings for giving access to the metal layer deposited in step 304. In step 310, another layer of connection material such as the ITO is patterned to make connections through the vertical interconnect openings created in step 308.

The completed TFT device as fabricated in accordance with the present disclosure is accomplished with the use of only five photolithographic masks. The TFT devices' physical dimensions, material compositions, and component locations are the same as those produced by the conventional fabrication flows utilizing six photoresist masks. The present disclosure allows for the process simplification of the TFT fabrication, allowing a single mask to be used to accomplish the tasks of two conventional masks. The reduction of photolithography processes provided by the present disclosure results with process simplifications that will translate into significant cost improvements for a given production facility to maintain highly competitive cost and output advantages over other manufacturers of similar product devices.

The method disclosed is suitable and compatible for implementation within existing, conventional and future fabrication process technologies. The above disclosure provides several examples for implementing the different features of the disclosure. Specific examples of components and processes are described to help clarify the disclosure. These are, of course, merely examples and are not intended to limit the scope of the disclosure from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for forming a thin film transistor comprising:
   forming a preliminary substrate having at least a silicon layer, a first dielectric layer, and a gate metal layer stacking up sequentially;
   forming a photoresist layer on top of the preliminary substrate;
   selectively removing a portion of the photoresist layer in a single exposure process to form a first photoresist pattern having a two-portion structure with a first portion having a first width and a second portion underneath the first portion with a second width;
   removing the gate metal layer, the first dielectric layer, and the silicon layer to have the same width as the second width;
   selectively reducing the first photoresist pattern to form a second photoresist pattern having the first width;
   reducing the gate metal layer to have the same width as the first width using the second photoresist pattern; and
   doping a predetermined impurity in the silicon layer for forming a source region and a drain region of a predetermined type in areas not directly underneath the reduced gate metal layer.

2. The method of claim 1 further comprising forming a second dielectric layer for covering the gate metal layer and exposing the source and drain regions by having openings through the first dielectric layer; and
   forming a first conducting layer making connection with the source and drain regions through the openings.

3. The method of claim 2 further comprising forming a passivation layer on top of the first conducting layer and the second dielectric layer.

4. The method of claim 3 wherein the forming a passivation layer further includes:
   forming one or more connection openings for connecting the first conducting layer to a second conducting layer; and
   forming the second conducting layer to make connections to the first conducting layer.

5. The method of claim 1 wherein the selectively removing a portion of the photoresist layer further includes selectively exposing the photoresist layer to a light source by using a predetermined mask with a first and second regions, the first region passing less light than the second region for forming the two-portion structure.

6. The method of claim 5 wherein the first and second regions of the mask are made of different materials.

7. A method for forming a thin film transistor comprising:
   forming a preliminary substrate having at least a silicon layer, a first dielectric layer, and a gate metal layer stacking up sequentially;
   forming a photoresist layer on top of the preliminary substrate;
   selectively removing a portion of the photoresist layer using a predetermined mask in a single exposure process to form a first photoresist pattern having a two-portion structure with a first portion having a first geometry and a second portion underneath the first portion with a second geometry;
   trimming the gate metal layer, the first dielectric layer, and the silicon layer to have the second geometry;

selectively reducing the first photoresist pattern to form a second photoresist pattern having the first geometry;

reducing the gate metal layer to have the same geometry as the first geometry using the second photoresist pattern; and doping a predetermined impurity in the silicon layer for forming a source region and a drain region of a predetermined type in areas not directly underneath the reduced gate metal layer.

8. The method of claim 7 further comprising forming a second dielectric layer for covering the gate metal layer and exposing the source and drain regions by having openings through the gate oxide layer; and forming a conducting layer to reach the source and drain regions through the openings.

9. The method of claim 8 further comprising forming a passivation layer on top of the conducting layer and the second dielectric layer.

10. The method of claim 9 wherein the forming a passivation layer further includes forming one or more connection openings for connecting the conducting layer to a routing metal layer formed on top of the passivation layer.

11. The method of claim 7 wherein the predetermined mask has a center and surrounding regions, the center region passing less light than the surrounding region for forming the two-portion structure.

12. The method of claim 11 wherein the center and surrounding regions of the mask are made of different materials with the material for the center region shielding more light than the material for the surrounding region.

13. The method of claim 11 wherein the first and second regions of the mask are made from a same material with a predetermined mask pattern on the surrounding region for hindering the light from passing therethrough.

14. A method for forming a thin film transistor on a substrate, the substrate having at least a silicon layer, a first dielectric layer, and a gate metal layer stacking up sequentially, the method comprising:

forming a photoresist layer on top of the substrate;

forming a first photoresist pattern in a single exposure process, the first photoresist pattern having a step structure with a center portion having a first width narrower than a second width of a bottom portion underneath;

trimming the gate metal layer, the first dielectric layer, and the silicon layer to have the same width as the second width;

reducing the first photoresist pattern to form a second photoresist pattern having the first width;

reducing the gate metal layer to have the same width as the first width using the second photoresist pattern;

doping a predetermined impurity in the silicon layer for forming a source region and a drain region of a predetermined type in areas not directly underneath the reduced gate metal layer;

forming a second dielectric layer for covering the gate metal layer and exposing the source and drain regions by having openings through the gate oxide layer; and forming a first conducting layer to reach the source and drain regions through the openings; and forming a passivation layer on top of the conducting layer and the second dielectric layer with one or more connection openings for connecting the first conducting layer to a second conducting layer.

15. The method of claim 14 wherein the routing layer is an indium tin oxide layer.

16. The method of claim 14 wherein forming a first photoresist pattern further includes using a predetermined mask having a first and second regions, the first region passing less light than the second region for forming the step structure.

17. The method of claim 16 wherein the first and second regions of the mask are made of different materials with the material for the first region shielding more light than the material for the second region.

18. The method of claim 16 wherein the first and second regions of the mask are made from a same material with a predetermined mask pattern covering the second region for hindering the light from passing therethrough.

19. The method of claim 14 wherein the reducing the first photoresist pattern further includes using a dry etch process to reduce the first photoresist pattern.

20. The method of claim 14 wherein the reducing the first photoresist pattern further includes using an auto plasma process to reduce the first photoresist pattern.

* * * * *